United States Patent [19]

Ohkawa et al.

[11] Patent Number: 5,321,299
[45] Date of Patent: Jun. 14, 1994

[54] HYBRID INTEGRATED CIRCUIT DEVICE

[75] Inventors: Katsumi Ohkawa; Hisashi Shimizu, both of Ohta; Hirofumi Kikuchi, Kiryu, all of Japan

[73] Assignee: Sanyo Electric Co., Ltd., Osaka, Japan

[21] Appl. No.: 951,348

[22] Filed: Sep. 25, 1992

Related U.S. Application Data

[63] Continuation of Ser. No. 706,940, May 29, 1991, abandoned.

[30] Foreign Application Priority Data

May 30, 1990 [JP] Japan .................... 2-138418
May 30, 1990 [JP] Japan .................... 2-138422

[51] Int. Cl.$^5$ .................................... H01L 23/02
[52] U.S. Cl. ........................... 257/528; 257/531; 257/532; 257/692; 323/222
[58] Field of Search ..................... 357/74, 75, 80; 257/369, 692, 500, 516, 517, 528, 531, 532; 363/44, 47, 48; 323/222

[56] References Cited

U.S. PATENT DOCUMENTS

| | | | |
|---|---|---|---|
| 4,712,169 | 12/1987 | Albach | 323/222 |
| 4,739,389 | 4/1988 | Goedbloed | 357/75 |
| 4,825,279 | 4/1989 | Furuhata | 357/72 |
| 5,067,006 | 11/1991 | Shiga | 357/80 |
| 5,091,772 | 2/1992 | Kohara et al. | 357/74 |

Primary Examiner—Rolf Hille
Assistant Examiner—Roy Potter
Attorney, Agent, or Firm—Spensley Horn Jubas & Lubitz

[57] ABSTRACT

Disclosed is a hybrid integrated circuit device provided with an active filter. The active filter is constructed mainly from a rectifier circuit, a reactor with one terminal connected with an output terminal of the rectifier, a switching element connected with one terminal of the reactor and a smoothing condenser connected with the other terminal of the reactor. The active filter is mounted on an insulating metal substrate and has, other than the above feature, a specific circuit structure wherein the substrate is divided by a ground pattern or power supply pattern into two blocks. One block is for a large current circuit such as the rectifier circuit, the switching element, and a diode and another block for a small signal circuit such as a control circuit. The hybrid integrated circuit device is of remarkably compact size. Also, it is greatly superior in a noise performance because switching noise does not flow into the chassis of electronic equipment from the metal substrate and the control circuit is shielded from the noise produced by the large current circuit, and also because the noise caused by wiring inductance can be limited.

10 Claims, 9 Drawing Sheets

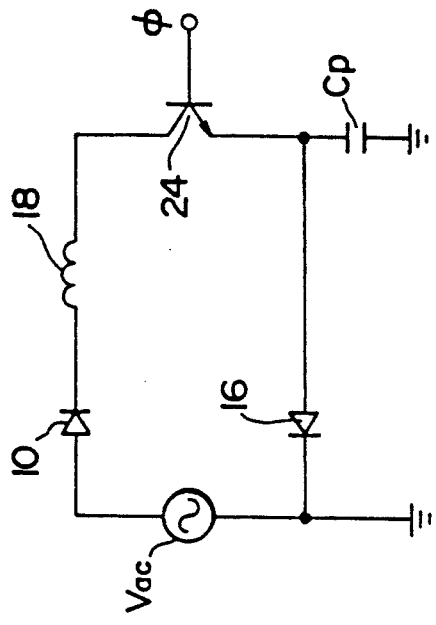
FIG. 3
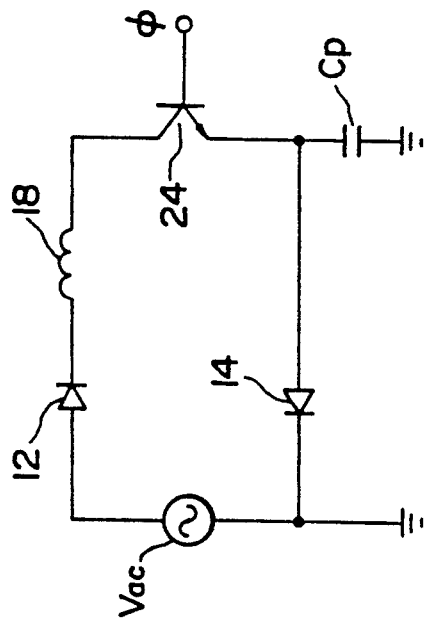
FIG. 4
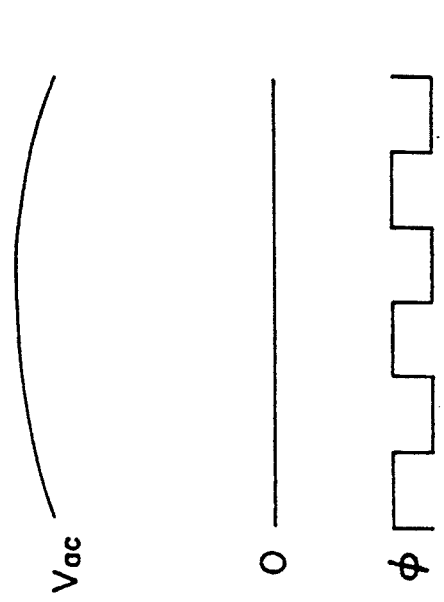
FIG. 2
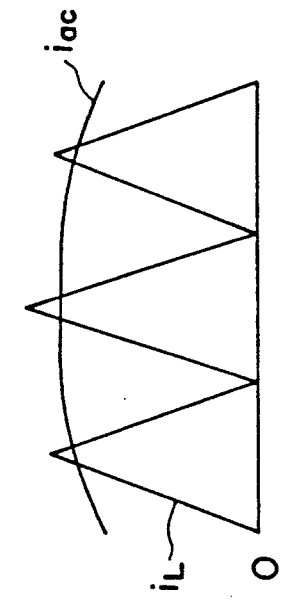

HYBRID INTEGRATED CIRCUIT DEVICE

This is a continuation of application Ser. No. 07/706,940 filed on May 29, 1991, now abandoned.

BACKGROUND OF THE INVENTION

1. Field of the Invention

The present invention relates to a hybrid integrated circuit device with a power active filter mounted on an insulating metal substrate, and more particularly to a hybrid integrated circuit device in which malfunction of a small signal circuit caused by switching noise can be avoided and a leak current from the insulating metal substrate caused by switching actions can be reduced.

2. Description of the Background Arts

A switching regulator, called the active filter has recently attracted remarkable attention.

With reference to FIG. 10, the active filter is constituted of a bridge rectifier circuit consisting of diodes 60–66; a reactor 68 connected between an a.c. input terminal of the bridge rectifier circuit and an a.c. power terminal with a voltage represented by $V_{ac}$; a transistor 70 connected in parallel between a pair of d.c. output terminals of the bridge rectifier circuit; a control circuit 76 which normally outputs the control pulse $\phi$ of a frequency over 15 KHz; a condenser 74 for smoothing a d.c. output of the bridge rectifier circuit; and a dumper diode 72 connected between the d.c. output terminal and the smoothing condenser 74.

When the control pulse $\phi$ of the control circuit 76 is a high level to turn on the transistor 70 during the half-period while the polarity of a.c. power supply of the reactor 68 in the active filter is positive, a closed circuit is formed between the reactor 68, the diode 60, the transistor 70, and the diode 66. A current flows from the a.c. power supply to the reactor 68, where the energy is stored up. After that, when the control pulse $\phi$ is at a low level to turn off the transistor 70, the closed circuit is opened and a counter electromotive force is produced in the reactor 68 at the same phase as that of the a.c. power supply. The sum of the counter electromotive force and the voltage of the a.c. power supply is input into the bridge rectifier circuit consisting of the diodes 60–66, and then by the output from the bridge rectifier circuit, the dumper diode 72 is forward-biased to charge the smoothing condenser 74.

Conversely, if, during the half-period while the polarity of a.c. power supply of the reactor 68 is negative, the control pulse $\phi$ of the control circuit 76 is at a high level to turn on the transistor 70, a closed circuit is formed between the reactor 68, the diode 64, the transistor 70, and the diode 62. A current flows from the a.c. power supply to the reactor 68, where the energy is stored up. After that, when the control pulse $\phi$ of the control circuit 62 is a low level to turn off the transistor 70, in the same manner as above the sum of the counter electromotive force of the reactor 68 and the voltage of the a.c. power supply is input into the bridge rectifier circuit, and then the output from the bridge rectifier circuit causes the dumper diode 72 to be forward-biased, thereby charging the smoothing condenser 74.

As discussed above, because a high voltage, which is the sum of the counter electromotive force and the voltage of the a.c. power supply, is input into the bridge rectifier circuit of the active filter, continuous power supply to a load side is allowed. The active filter in comparison with ordinal switching regulators possesses the advantage of no switching actions at high voltages and currents. This type of active filter and a switching regulator used therein are, for example, disclosed in Japanese Patent Laid-open (Kokai) No. 150,972/1981.

Conventionally, the active filter is constituted of discrete parts. Switching regulators consisting of such discrete parts, however, requires lengthy wirings between the discrete parts, and thus it has the disadvantage of inducing a new noise caused by inductance components of the wires. This type of active filter must therefore be sealed within a large housing, and hence a demand for power devices of more decreased size has never been satisfied. In order to solve this problem, the present inventors have proposed in Japanese Patent Application No. 2580/1988 a hybrid integrated circuit device with an active filter mounted on an insulating metal substrate.

Referring to FIG. 11, this hybrid integrated circuit device is provided with a metal (for example, aluminum) substrate 80, and both surfaces of the substrate are coated with insulating oxide films 82 made by means of an anodic oxidation process. On one of the insulating oxide films 82, a conductive pattern 86 made from a copper foil is formed through an insulating resin layer 84 of, for example, epoxy Diodes 60–66 (not shown), a transistor 70, and other circuit elements for a control circuit 76 (not shown), which are all in a chip form, are mounted on the conductive pattern 86 to form the hybrid integrated circuit device. An excellently minimized active filter is thus realized. Additionally, as shown in FIG. 11, a ground pattern among the conductive pattern 86 is connected with the metal substrate 80 beneath the insulating oxide film 82 by a bonding wire 88 for purposes of removing floating capacitance caused by the insulating oxide film 82 and insulating resin layer 84.

Generally, incorporation of such hybrid integrated circuit device into electronic equipment is accomplished in a structure with excellent heat dissipation characteristics, that is, attaching to a chassis the insulating oxide film 82 on the other surface (the back surface) of the metal substrate 80. In this structure, however, the insulating oxide film 82 serves as a dielectric between the metal substrate 80 and the chassis of electronic equipment and as a result floating capacitance may arise on the entire surface of the metal substrate 80.

The hybrid integrated circuit device having the above structure was found to have a specific problem peculiar to the use of an insulating metal substrate. In other words, the potential at an emitter of the transistor 70 of the active filter largely fluctuates with high frequencies, leading to occurrence of noise in the chassis of electronic equipment.

Referring to FIGS. 12 and 13, the problem will be reasonably explained.

FIG. 12 shows an equivalent circuit for the hybrid integrated circuit device during the half-period while the polarity of power-a.c. current at the reactor 68 side is positive. During the positive-going half-period, the reactor 68, the diode 60, the transistor 70 and the diode 66 forms a closed circuit, and the reactor 68 serves as a collector load of the transistor 70.

Conversely, FIG. 13 shows an equivalent circuit for the hybrid integrated circuit device during the half-period while the polarity of power-a.c. current at the reactor 68 side is negative. During the negative-going half-period, the diode 62, the transistor 70, the diode 64, and the reactor 68 forms a closed circuit and the reactor 68 serves as an emitter load of the transistor 70.

As discussed above, during the positive-going half-period (see FIG. 12), the potential at the collector of the transistor varies as if it were switched with the frequency of control pulse $\phi$ between the charge potential of the smoothing condenser 74 and the ground potential. Here, the potential at the emitter is kept at the ground potential. On the other hand, during the negative-going half-period (see FIG. 13), the reactor 68 serves as the emitter load of the transistor 70, and hence the potential of the emitter varies as if it were switched with the frequency of control pulse $\phi$ between the charge potential of the smoothing condenser 74 and the ground potential.

Because the ground pattern of the hybrid integrated circuit device is connected with the aluminum substrate 80 by the bonding wire 88 as shown in FIG. 11, the potential at the aluminum substrate 80 varies as if it were switched with the frequency of control pulse $\phi$ between the charge potential of the smoothing condenser 74 and the ground potential during the negative-going half-period. These potential variations are delivered into the chassis of electronic equipment as a switching noise due to the effect of the floating capacitance $C_p$ produced between the aluminum substrate 80 and the chassis of electronic equipment.

In addition, in the hybrid integrated circuit device of this type, the switching noise produced in its main circuit enters a small signal circuit, for example, a control circuit for controlling the transistor 70, through the circuit patterns that are combined electrostatically or inductively. This may give an obstacle to the operation of the device.

Furthermore, with switching regulators of this type, accumulation and dissipation of energy in the reactor 68 are carried out in a limited time, and therefore the working speed of the active filter is determined by the inductance of the reactor 68 and hence high operation speed can not be achieved.

SUMMARY OF THE INVENTION

Accordingly, a first object of the present invention is to provide a hybrid integrated circuit device in which the switching noise caused by switching actions of an active filter can be prevented from flowing into a chassis of electronic equipment.

A second object of the present invention is to provide a compact hybrid integrated circuit device wherein a radiation of the noise from wires between circuit elements can be restrained.

A third object of the present invention is to provide a hybrid integrated circuit device which can promptly attenuate high harmonic noise at the nearest position to the source of noise and has a high heat dissipation characteristic.

A fourth object of the present invention is to provide a hybrid integrated circuit device in which an outward emission of noise can be restrained.

A fifth object of the present invention is to provide a hybrid integrated circuit device wherein a small signal circuit can be shielded from the noise produced in a large current circuit.

A sixth object of the present invention is to provide a hybrid integrated circuit device provided with a switching regulator which can operate at high speed and has reduced ripples.

The first to fourth objects can be achieved by a first embodiment of the present invention provided with an active filter mounted on an insulating metal substrate. The active filter includes a rectifier circuit and a reactor. One terminal of the reactor is connected with the output terminal of the rectifier circuit. The other terminal of the reactor is connected with a terminal of a switching element and smoothing condenser.

With this circuit structure, where the reactor serves as a collector load in every phase of a.c. power supply, no high frequency switching voltage is applied to a ground pattern, and hence also to the metal substrate. As a result the switching noise produced due to floating capacitance caused by the mounting structure of the hybrid integrated circuit device is prevented from flowing outside. Additionally the device is improved in its heat dissipation and noise-shielding characteristics due to its substrate structure using an insulating metal substrate. Also the high harmonic noise is attenuated at the nearest position to the source of noise due to the capacitance formed between the insulating metal substrate and the circuit pattern. Furthermore, the fifth object of the present invention can be achieved by dividing large current circuit elements from small signal circuit elements by using a ground pattern positioned around the center of the circuit substrate.

The first to fourth and sixth objects can be achieved by mounting, on an insulating metal substrate, an active filter having a circuit structure constructed from a plurality of unit circuits connected in parallel, the unit circuit each including a rectifier circuit and a reactor, one terminal of the reactor being connected with the output terminal of the rectifier circuit and the other terminal being connected with one terminal of a switching element and diode, wherein each switching element operates in a specified phase.

With such circuit structure, when a specified reactor is supplied with energy, other reactors discharge energy. This allows high speed operation. Also, the a.c. input current or the a.c. charge current of a smoothing condenser is the sum of currents flowing through the plurality of reactors, thereby lowering a high harmonic noise level.

Other objects, features and advantages of the invention will hereinafter become more readily apparent from the following description.

BRIEF DESCRIPTION OF THE DRAWINGS

FIG. 2 is a performance waveform diagram for explaining the first embodiment of the present invention;

FIG. 3 is an equivalent circuit diagram at a first phase of a.c. power supply for explaining the first embodiment of the present invention;

FIG. 4 is an equivalent circuit diagram at a second phase of a.c. power supply for explaining the first embodiment of the present invention;

DETAILED DESCRIPTION OF THE INVENTION AND PREFERRED EMBODIMENTS

Referring to FIG. 1 to FIG. 6, the first embodiment of the present invention is now explained.

Figure 1:
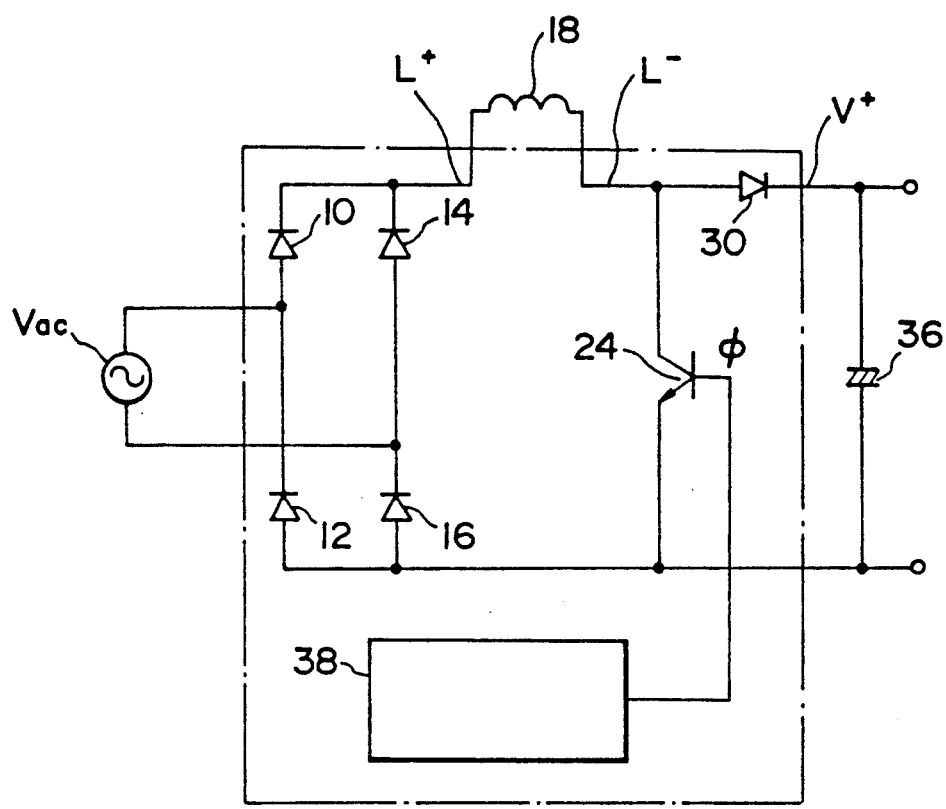
FIG. 1 is an equivalent circuit diagram for explaining a first embodiment of the present invention.

FIG. 1 shows a circuit diagram for explaining an active filter used for the first embodiment of the present invention. As shown in the drawing the active filter comprises a bridge rectifier circuit consisting of diodes 10–16; a reactor 18 with one terminal connected to the positive d.c. output terminal of the bridge rectifier circuit; a transistor 24 including a collector and an emitter which are positioned between and connected with the other terminal of the reactor 18 and ground respectively; a dumper diode 30 with an anode connected to the collector of the transistor 24; a smoothing condenser 36 positioned between and connected to the cathode of the dumper diode 30 and ground; and a control circuit 38 for supplying control pulse $\phi$ to the base of the transistor 24.

The main circuit of the control circuit 38 includes a microcomputer and outputs control pulse $\phi$ of a frequency over 15 KH$_z$. While not shown, this control circuit 38 detects the magnitude of load current and performs a feedback control by frequency of control pulse $\phi$ or by duty control. Also, the control circuit 38 measures a substrate temperature and an emitter current value to control the active filter, which may otherwise thermally run away. Stated further, the microcomputer is used for the control circuit 38 of the instant embodiment, although the desired control can be carried out by any known circuit structure using a comparator or operational amplifier.

The transistor 24 is not limited to those having a bipolar structure as shown in the drawing, but it may be replaced with other elements operable at high speed, such as a power-MOS transistor, SIT, or IGBT. Additionally the rectifier circuit to be used is not limited to the bridge rectifier circuit shown in the drawing, but rectifier circuits of any known type may be adopted.

With reference to FIG. 2, the performance of the active filter will be explained. During the half-period, while the contact potential between the diode 10 and diode 12 is positive, the transistor 24 is on if the control pulse $\phi$ of a frequency over 15 KH$_z$ output from the control circuit 38 is at a high level. The diode 10, reactor 18, transistor 24, and diode 16 form a closed circuit and the reactor 18 gains the current i$_L$. Then, when the control pulse $\phi$ is at a low level, the transistor 24 is off, and the closed circuit is opened, the reactor 18 generates counter electromotive force so as to retain its preceding electric condition. The voltage summed up of the counter electromotive force of the reactor 18 and of the bridge rectifier circuit output exceeds the charge voltage of the smoothing condenser 36 after a long period of time in comparison with a system using a condenser input-type rectifier circuit, and the smoothing condenser 38 is charged accordingly.

Conversely, during the half-period while the contact potential between the diode 10 and diode 12 is negative, the transistor 24 is on if the control pulse $\phi$ is at a high level. The diode 14, reactor 18, transistor 24, and diode 12 form a closed circuit and the reactor 18 gains the current i$_L$. Then, when the control pulse $\phi$ is at a low level, the transistor 24 is off, and the closed circuit is opened, the reactor 18 generates counter electromotive force in the same manner as above. As a result the smoothing condenser 36 is charged with the voltage summed up of the counter electromotive force of the reactor 18 and of the bridge rectifier circuit output.

Referring to FIG. 3 and FIG. 4, the performance of the active filter mounted on a hybrid integrated circuit device is now discussed.

FIG. 3 shows an equivalent circuit of the hybrid integrated circuit device during the half-period, when the a.c. supply voltage at the contact between the diode 10 and the diode 12 is positive. During the positive-going half-period, the diode 10, reactor 18, transistor 24, and diode 16 form a closed circuit and hence the reactor 18 is situated to be a collector load of transistor 24.

FIG. 4 shows an equivalent circuit of the hybrid integrated circuit device during the half-period, when the a.c. supply voltage at the contact between the diode 10 and the diode 12 is negative. During the negative-going half-period, the diode 12, reactor 18, transistor 24, and diode 14 form a closed circuit and hence the reactor 18 serves as a collector load of the transistor 24 in a similar manner as in the positive-going half-period.

With the active filter having this circuit structure, the reactor 18 is always routed to the collector side of transistor 24 during either of the positive and negative-going half-periods of the a.c. power supply so that the emitter potential of the transistor 24 is kept stable at the ground potential.

Figure 5:
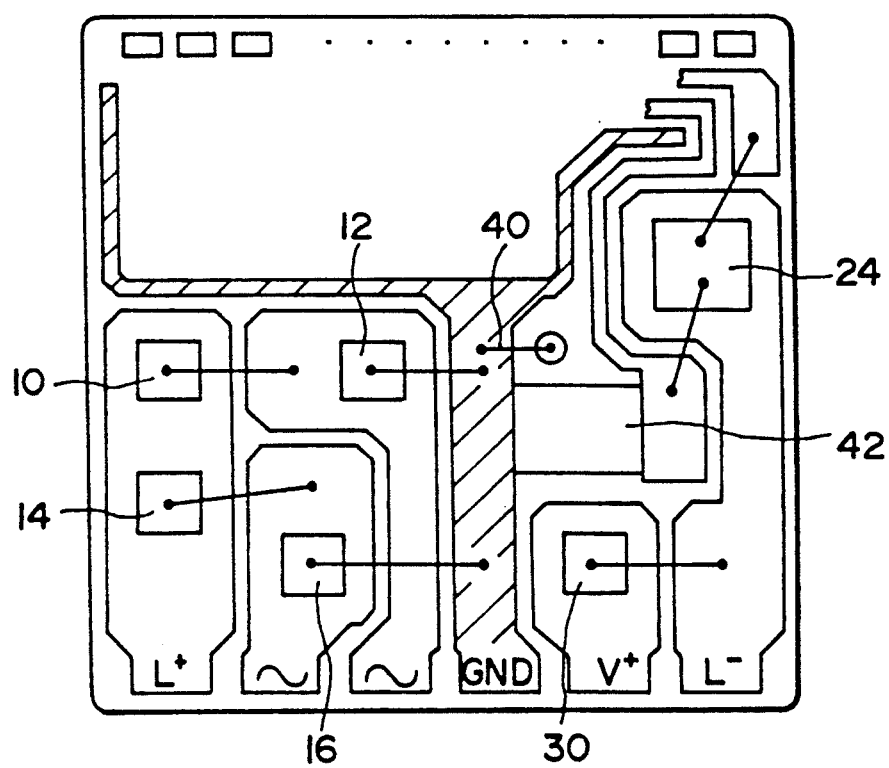
FIG. 5 is a plan drawing for explaining the first embodiment of the present invention.

FIG. 5 is referred to for explaining a concrete structure of an embodiment provided with the active filter excluding the reactor 18 and the smoothing condenser 36, which active filter is mounted on the insulating metal substrate.

The shaded circuit pattern is the ground pattern. The circuit substrate is divided into two blocks by the ground pattern: one block for a small signal circuit corresponding to almost the upper half of the substrate (space part) in the drawing and another block for a large current circuit corresponding to the lower half of the substrate in the drawing. In this embodiment, wirings for supplying the control pulse $\phi$ from the small signal circuit block to the large current circuit block and for supplying the emitter potential of transistor 24 from the large current circuit block to the small signal circuit block are routed likely to detour around a part of the ground pattern. However, there is no limitation on these wiring methods or routs, and, for example, the wiring for the emitter potential of transistor 24 to a specified position of the small signal circuit may be performed by means of wire bonding (jumping wire connection).

Also, the ground pattern is connected to the aluminum substrate by a bonding wire 40 at the nearest position to the emitter of transistor 24 through which large current with high frequencies flows, and thus the aluminum substrate has the same potential as that of the ground pattern.

In the large current block, the diodes 10-16 which construct the bridge rectifier circuit; the dumper diode 30; and the transistor 24 are mounted on the substrate through a heat sink, and also formed is an emitter resistance 42 for controlling the emitter current of transistor 24 and for measuring a value of the emitter current. Each position of these circuit elements is arranged so that large current never flows into the ground pattern that divides the small signal circuit block from the large current circuit block. By this means the ground pattern can be shielded more effectively. Stated additionally, the large current circuit block may be divided from the small signal circuit block by a power supply pattern having a stable potential. The power supply pattern has the same effects as those of the ground pattern.

External lead terminals for connecting the large current circuit block with an external circuit are located in the peripheral ends of the substrate other than those in which external leads for the small signal circuit block are located. By this measure, intrusion of noise from the large current circuit block into the small signal circuit block through these respective external leads can be avoided.

Figure 11:
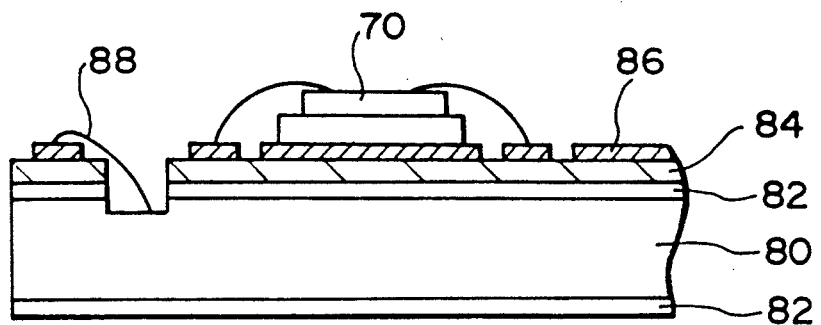
FIG. 11 is a sectional drawing for schematically illustrating a hybrid integrated circuit device.

Further, since the distance between the dumper diode 30 and the smoothing condenser 36 which is externally connected has a great influence on the performance of the active filter, the dumper diode 30 is located adjacent to a terminal represented by the character V+ as shown in FIG. 5. This terminal V+ is positioned adjacent to a ground terminal GND in the same reason as above. Here, the sectional structure of the hybrid integrated circuit device as shown in FIG. 5 is the same as that in FIG. 11 and therefore further explanations are omitted.

In the hybrid integrated circuit device of the present invention, the chassis of electronic equipment is attached to the back of the insulating metal substrate. This structure allows the capacitance $C_p$ to exist between a metal substrate of the insulating metal substrate and the chassis as previously explained in FIGS. 3 and 4. However, because the metal substrate is connected with the ground pattern (see the shaded portion in FIG. 5) by the bonding wire 40, the metal substrate has the same potential as that of the ground pattern. In the present invention, the potential of the ground pattern, that is, the emitter potential of transistor 24, is kept stable at the ground potential so that there is no fear that the switching noise will flow into the chassis due to the floating capacitance $C_p$ during the half-period while the power-a.c. current is negative.

Figure 6:
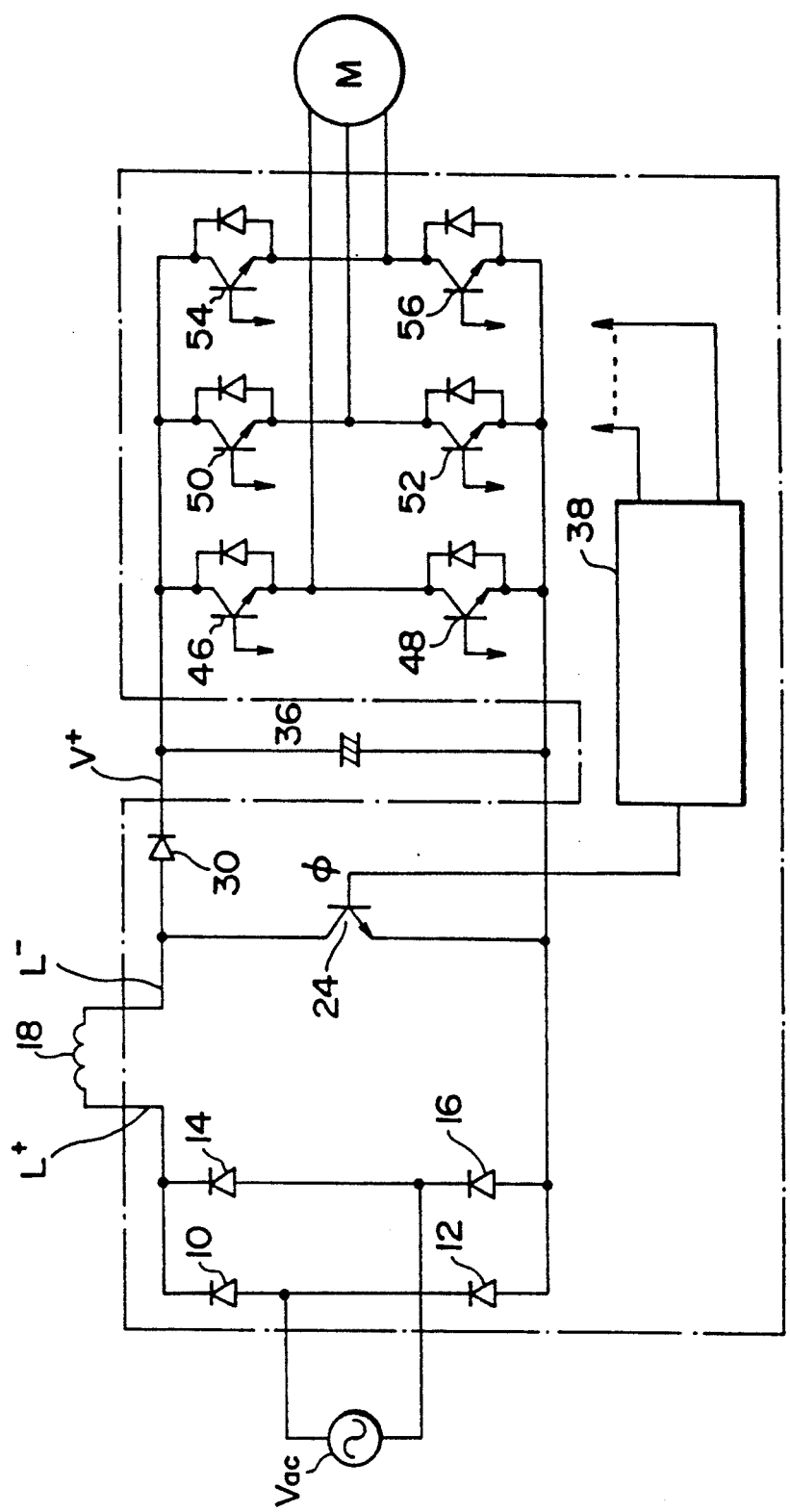
FIG. 6 is an equivalent circuit diagram for explaining a modification of the first embodiment of the present invention.

FIG. 6 is a circuit diagram for explaining a modification of the previous embodiment of the present invention. The control circuit 38 of the previous embodiment generally functions to output a polyphase pulse for controlling an invertor circuit, and externally output the polyphase pulse from the hybrid integrated circuit device. This type of hybrid integrated circuit device has the advantage that it can be made on a considerably small scale, but it requires many terminals for outputting externally the polyphase pulse.

On the contrary, the modification has a structure where even three-phase invertor circuit consisting of transistors 42-46 is mounted on a single substrate and polyphase pulses are input into bases of transistors 46-56 from the control circuit 38 through a circuit pattern formed on the circuit substrate. By this structure terminals used in the hybrid integrated circuit device can be reduced, and also the intrusion of noise into wirings between the active filter and the invertor circuit can be avoided.

Figure 7:
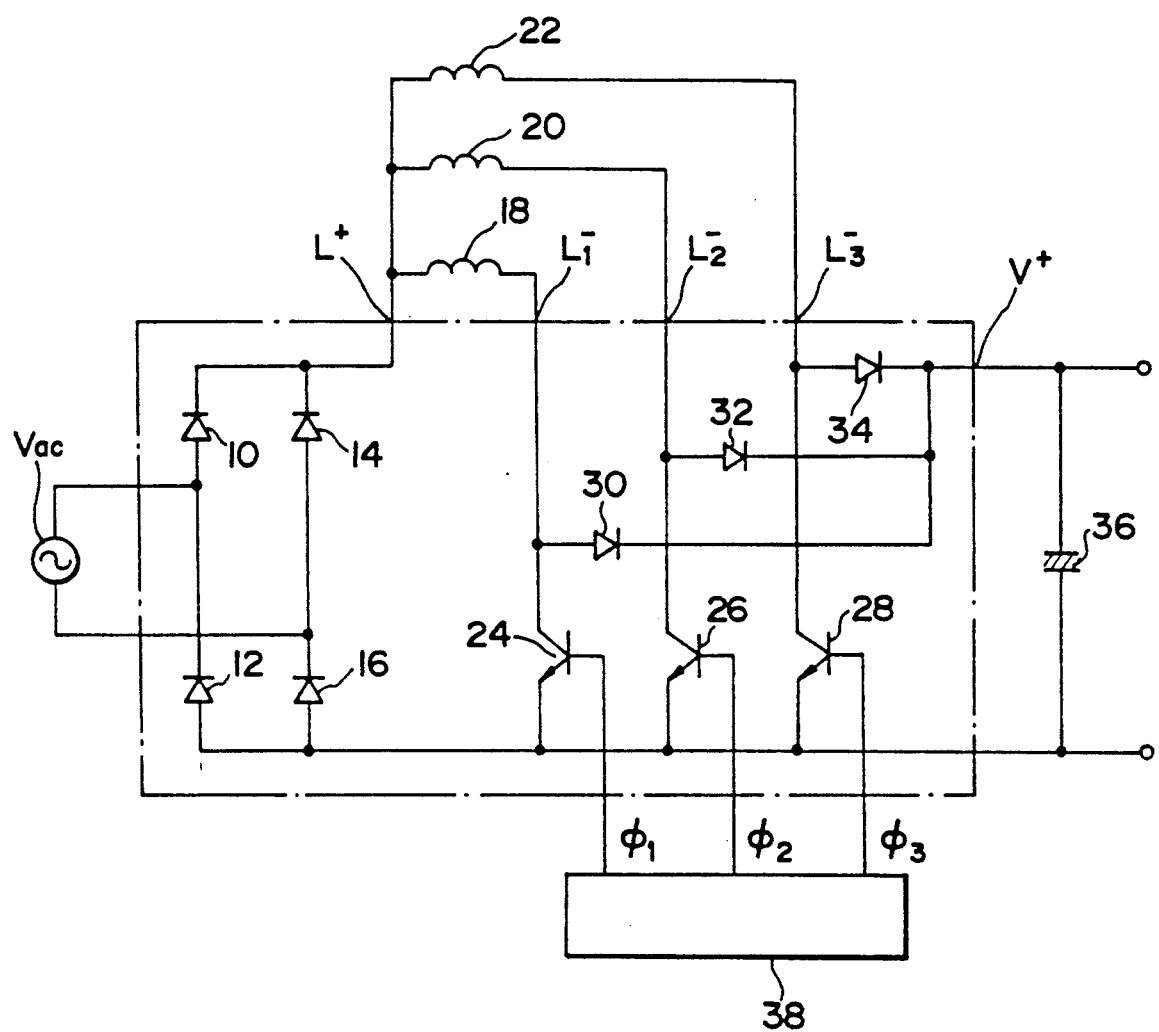
FIG. 7 is an equivalent circuit diagram for explaining a second embodiment of the present invention.

Next, referring to FIGS. 7-9, a second embodiment of the present invention will be explained. FIG. 7 shows a circuit structure of an active filter which has a specific feature represented by the second embodiment.

This active filter, as shown in FIG. 7, comprises a bridge rectifier circuit including diodes 10-16; a plurality of reactors 18-22 with each terminal connected to the positive d.c. output terminal of the bridge rectifier circuit; a plurality of transistors 24-28 including respective collectors and emitters positioned between and connected to the reactors 18-22 and a ground respectively; dumper diodes 30-34 with respective anodes connected to the respective collectors of transistors 24-28 and with cathodes connecting in common; a smoothing condenser 36 connected to the cathodes of the dumper diodes 30-34; and a control circuit 38 for supplying control pulses $\phi_1$-$\phi_3$ to respective bases of transistors 24-28.

The embodiment shown in the drawing is provided with three unit circuits which each include a rector, a transistor, and a dumper diode. The number of unit circuits is, however, optional and may be two or more than three.

The main circuit of the control circuit 38 is constructed from a microcomputer and outputs the control pulses $\phi_1$-$\phi_3$ of a frequency over 15 KHz. Also, while not shown, the control circuit 38 detects the magnitude of load current and performs a feed-back control by the frequency of control pulses $\phi_1$-$\phi_3$ or by duty control. Also, the control circuit 38 measures a substrate temperature and an emitter current value to control the active filter, which may otherwise thermally run away. Stated further, a microcomputer is used for the control circuit 38 of the instant embodiment, although a specified control can be carried out by any known circuit structure using a comparator or operational amplifier.

The transistors 24-28 are not limited to those having a bipolar structure as shown in the drawings in the same manner as in the previous embodiment, but they can be replaced with other elements operable at high speed, such as a power-MOS transistor, SIT, or IGBT. Additionally the rectifier circuit to be used is not limited to the bridge rectifier circuit as shown in the drawing, but they may be of any known type.

Figure 8:
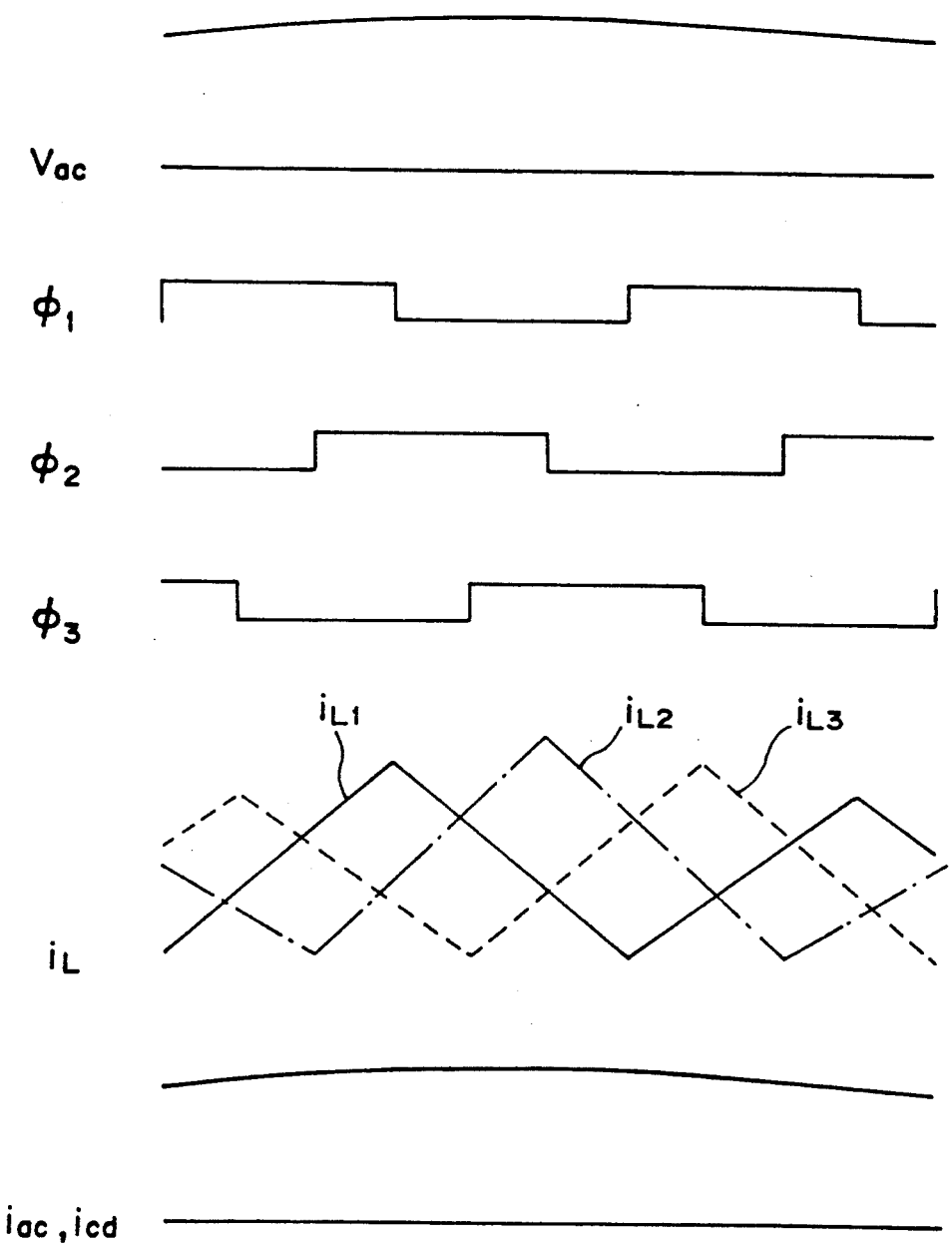
FIG. 8 is a performance waveform diagram for explaining the second embodiment of the present invention.

With reference to FIG. 8, the performance of the active filter having the above structure will be explained. The control pulses $\phi_1$-$\phi_3$ output to respective bases of transistors 24-28 have a 120° phase difference from each other in the embodiment shown in the drawing.

When the control pulse $\phi_1$ is at a high level to turn on the transistor 24, the reactor 18 gains the current $i_{L1}$. Then, when the control pulse $\phi_1$ is at a low level to turn off the transistor 24, the reactor 18 generates counter electromotive force so as to retain its preceding electric condition. The counter electromotive force of the reactor 18 has the same polarity as that of the bridge rectifier circuit output voltage. The smoothing condenser 36 is permitted to start charging by the voltage summed up of the counter electromotive force of the reactor 18 and the bridge rectifier circuit output voltage.

Just at the right time when the control pulse $\phi_1$ is at a low level, the transistor 26 turns on by the control pulse $\phi_2$ independently of the above operation to allow the current $i_{L2}$ to flow into the reactor 20. Therefore the reactor 20 can start the charging of the smoothing condenser 36 immediately after the reactor 18 has completed the charging of the smoothing condenser 36.

In the same manner as above, reactors 18–22 sequentially perform charging-discharging under control of the unit circuit constructed from reactors 18–22, transistors 24–28, and dumper diodes 30–34.

With the active filter of the present invention having the above characteristics, the current $i_{ac}$ from the a.c. power supply or the charge current $i_{cd}$ of the smoothing condenser 36 is the sum of currents flowing through the reactors 18–22, and hence a waveform of current $i_{ac}$ or $i_{cd}$ is extremely similar to that of power-a.c. potential $V_{ac}$. Therefore a degree of high harmonic wave noise is reduced, and ripples of the condenser charging current and high frequency noise caused by the ripples can be also reduced. Also, because energy is accumulated in the reactor 20 while the reactor 18 discharges energy, the operation speed of the active filter is multiplied by the number of unit circuits which are constructed from the reactors 18–22, transistors 24–28, and the dumper diodes 30–34.

Figure 9:
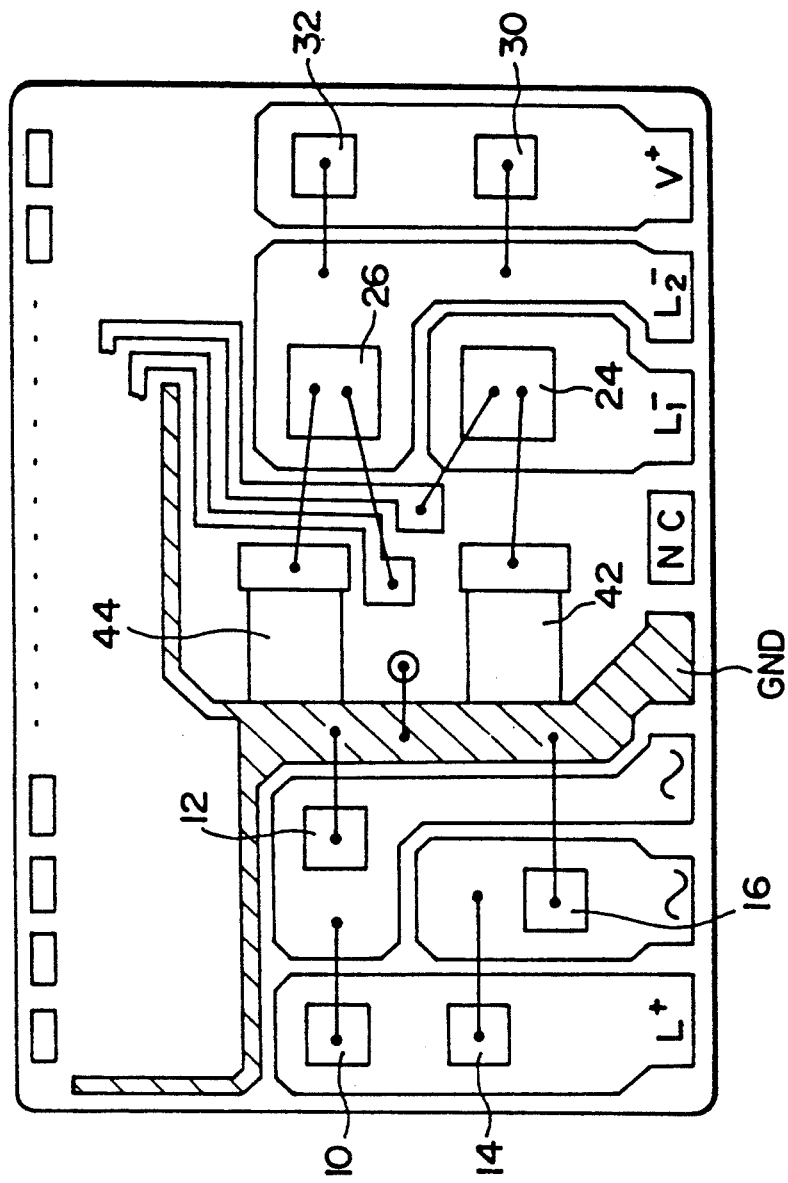
FIG. 9 is a plan drawing for explaining the second embodiment of the present invention.
Figure 10:
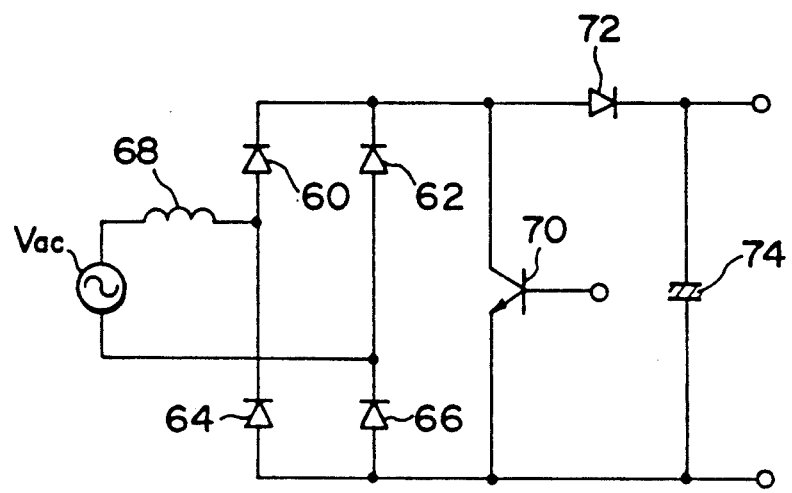
FIG. 10 is a circuit diagram for explaining a conventional switching regulator.

FIG. 9 is referred to for explaining a concrete structure of an embodiment provided with the active filter excluding the reactors 18–22 and the smoothing condenser 36, which active filter is mounted on the insulating metal substrate. The drawing exemplarily shows two parallel unit circuits including reactors, transistors, and dumper diodes. A system where these elements are incorporated into a hybrid integrated circuit device has the same performance as in the previous embodiment. That is, the reactors 18–22 are always routed to the collector sides of transistors 24–28 during either of the positive and negative-going half-periods so that emitter potentials of the transistors 24–28 are kept stable at the ground potential. So, further explanations are omitted.

The shaded circuit pattern is the ground pattern. The circuit substrate is divided into two blocks by the ground pattern: one block for a small signal circuit corresponding to almost the upper half of the substrate (space part) in the drawing and another block for a large current circuit corresponding to the lower half of the substrate in the drawing. In this embodiment, wirings for supplying the control pulses $\phi_1$, $\phi_2$ from the small signal circuit block to the large current circuit block and for supplying the emitter potentials of transistors 24, 26 from the large current circuit block to the small signal circuit block are routed so as to detour around a part of the ground pattern. However, there is no limitation on these wiring methods or routs, and, for example, jumping wire connection can be acceptable.

The ground pattern is connected to the aluminum substrate by the bonding wire 40 at the nearest position to either of the emitters of transistor 24, 26 into which a large current with high frequencies flows, and thus the aluminum substrate has the same potential as that of the ground pattern.

In the large current circuit block, the diodes 10–16 which construct the bridge rectifier circuit, dumper diodes 30, 32, and the transistors 24, 26 are mounted on the substrate through a heat sink, and also formed is emitter resistances 40, 42 for controlling the emitter currents of transistors 24, 26 and for measuring the values of emitter currents. Each position of these circuit elements is arranged so that a large current never flows into the ground pattern that divides the small signal circuit block from the large current circuit block. In addition, a group of external lead terminals for the large current circuit block and a group of those for the small signal circuit block are positioned in the opposite peripheral ends of the substrate so that both the groups are loosely combined.

Figure 12:
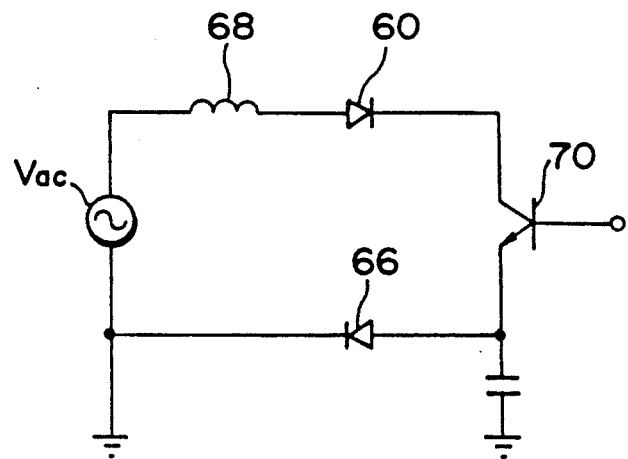
FIG. 12 is an equivalent circuit diagram at a first phase of a.c. power supply for explaining a conventional hybrid integrated circuit device.
Figure 13:
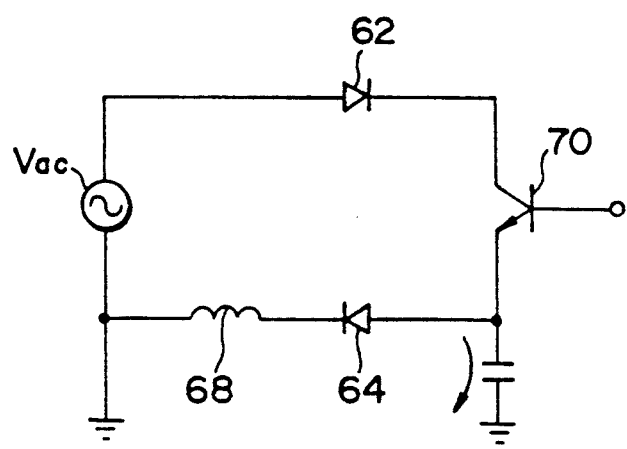
FIG. 13 is an equivalent circuit diagram at a second phase of a.c. power supply for explaining the conventional hybrid integrated circuit device.

A modification of this embodiment is possible wherein invertor circuits are mounted on the same substrate. As to a sectional structure of this hybrid integrated circuit device, explanations are omitted since the structure is common with that in FIG. 12.

As shown in the above detailed explanation, the hybrid integrated circuit device of the present invention has various advantages.

First, because the emitter potential of the transistor in the active filter is kept at the ground potential at high frequencies, there is no fear that switching noise will flow into the chassis of electronic equipment from the metal substrate of the hybrid integrated circuit device. Also, a hybrid integrated circuit device with a compact active filter mounted can be realized.

Second, the large current circuit is divided by the ground pattern from the control circuit, thereby shielding the control circuit from the noise produced by the large current circuit.

Third, electronic elements are incorporated into the hybrid integrated circuit device so that wirings between these elements can be reduced and hence the noise caused by wiring inductance can be limited.

Fourth, since an insulating metal substrate is used as the circuit substrate, relatively large capacitance is produced between the wiring pattern and the metal substrate to attenuate promptly high harmonic noise at the closest position to the source of noise.

Fifth, by the use of the insulating metal substrate, better heat dissipation characteristics are given and hence the active filter is of reduced size.

Sixth, because the insulating metal substrate is used, excess radiation out of the hybrid integrated circuit device can be restrained.

Seventh, the second embodiment of the present invention has a structure comprising as the active filter a paralleled plurality of unit circuits constructed from the reactors, transistors, and diodes positioned between the output terminal of the rectifier circuit and the smoothing condenser. This structure permits the reactor to charge and to discharge independently so that at least one of reactors is charged at any time from the rectifier circuit, while at least one of other reactors charges the smoothing condenser at any time. By this devised structure of the active filter of the present invention, the a.c. supply current or the charge current of the smoothing condenser 32 is the sum of currents flowing through the reactor, and hence a degree of high harmonic wave noise is reduced and high speed operation can be achieved.

Obviously, numerous modifications and variations of the present invention are possible in light of the above teachings. It is therefore to be understood that within the scope of the appended claims, the invention may be practiced otherwise than as specifically described herein.

What is claimed is:

1. A hybrid integrated circuit device comprising at least a rectifier circuit; a plurality of switching elements; and a plurality of diodes each having a terminal connected to a respective one of the switching elements, other terminals being connected in common, to constitute an active filter mounted on a circuit pattern formed on an insulating metal substrate, wherein a plurality of reactors is connected between a d.c. output terminal of the rectifier circuit and the switching elements respectively, a smoothing condenser is connected with the common connection terminal of the diodes, and a ground pattern of the circuit pattern is connected with the metal substrate.

2. The hybrid integrated circuit device according to claim 1 wherein the insulating metal substrate comprises an aluminum substrate and an oxide film formed by anodic oxidation of the surface of said aluminum substrate.

3. The hybrid integrated circuit device according to claim 1 wherein each switching element is composed of a bipolar transistor, a MOS transistor, a SIT or an IGBT.

4. A hybrid integrated circuit device comprising: a metal substrate having a surface and provided with an insulating layer on the surface; a first metallization pattern formed on the insulating layer; a rectifier circuit, a switching element and a diode all formed on said first metallization pattern, said rectifier circuit having a d.c. output terminal, said switching element defining a controllable current flow path and said diode having an input side and an output side, with said input side being connected to said current flow path of said switching element; an inductor connected between said d.c. output terminal of said rectifier circuit and said current flow path of said switching element; a smoothing capacitor connected to the output side of said diode; a control circuit disposed on said insulating layer; wherein said rectifier circuit, said switching element, said diode, said inductor, said smoothing capacitor and said control circuit constitute an active filter, said rectifier, said switching element and said diode constitute portions of a large current circuit and said control circuit constitutes a portion of a small signal circuit; and wherein said device further comprises a second metallization pattern formed on said insulating layer at a location between said portions of the large current circuit and said control circuit, and means for placing said second metallization pattern at a selected electric potential.

5. A hybrid integrated circuit device comprising: a metal substrate having a surface and provided with an insulating layer on the surface; a first metallization pattern formed on the insulating layer; a rectifier circuit, a switching element and a diode all formed on said first metallization pattern, said rectifier circuit having a d.c. output terminal, said switching element defining a controllable current flow path and said diode having an input side and an output side, with said input side being connected to said current flow path of said switching element; an inductor connected between said d.c. output terminal of said rectifier circuit and said current flow path of said switching element; a smoothing capacitor connected to the output side of said diode; a control circuit disposed on said insulating layer; wherein said rectifier circuit, said switching element, said diode, said inductor, said smoothing capacitor and said control circuit constitute an active filter, said rectifier, said switching element and said diode constitute portions of a large current circuit and said control circuit constitutes a portion of a small signal circuit; and wherein said device further comprises a ground pattern formed on said insulating layer and conductively connected to said metal substrate.

6. The hybrid integrated circuit device according to claim 2, 4 or 5, wherein the rectifier circuit is constructed from a bridge rectifier circuit.

7. The hybrid integrated circuit device according to claim 4 or 5, wherein the switching element is constructed from a bipolar transistor, a MOS transistor, a SIT, or an IGBT.

8. The hybrid integrated circuit device according to claim 1 or 5, wherein the ground pattern and the metal substrate are connected by means of wire bonding.

9. The hybrid integrated circuit device according to claim 4 or 5 wherein said metal substrate is made of aluminum and said insulating layer comprises an oxide film formed by anodic oxidation of the surface of said metal substrate.

10. A hybrid integrated circuit device comprising:
an insulating metal substrate;
a rectifier circuit mounted on the insulating metal substrate and having a d.c. output terminal;
a switching element mounted on the insulating metal substrate and defining a controllable current flow path;
a diode mounted on the insulating metal substrate and having an input side and an output side, with said input side being connected to said current flow path of said switching element;
an inductor connected between said d.c. output terminal of said rectifier circuit and said current flow path of said switching element;
a smoothing capacitor connected to the output side of said diode; and
a control circuit connected to said switching element for controlling the current flow path defined by said switching element.

* * * * *